United States Patent [19]

Sidman

[11] 4,153,870
[45] May 8, 1979

[54] INTEGRAL CYCLING RELAY

[75] Inventor: Michael D. Sidman, Malden, Mass.

[73] Assignee: Gould Inc., Rolling Meadows, Ill.

[21] Appl. No.: 831,857

[22] Filed: Sep. 9, 1977

Related U.S. Application Data

[63] Continuation of Ser. No. 667,712, Mar. 17, 1976, abandoned.

[51] Int. Cl.² ............................................. G05F 3/04
[52] U.S. Cl. ...................................... 323/18; 323/21; 323/24
[58] Field of Search .................. 307/252 UA; 323/18, 323/21, 22 SC, 24

[56] References Cited

U.S. PATENT DOCUMENTS

| | | | |
|---|---|---|---|
| 3,579,096 | 5/1971 | Buchanan | 307/133 X |
| 3,668,422 | 6/1972 | Pascente | 317/11 A |
| 3,917,962 | 11/1975 | Pascente | 307/252 UA |
| 3,940,634 | 2/1976 | Grogan | 307/252 UA |
| 3,940,684 | 2/1976 | Heinzman et al. | 323/18 X |
| 4,024,457 | 5/1977 | Riddle | 307/252 UA |

OTHER PUBLICATIONS

Malarkey, "Solid State Relays for AC Power Control", Motorola AN-755, 1975, pp. 3-5.

*Primary Examiner*—A. D. Pellinen
*Attorney, Agent, or Firm*—Schiller & Pandiscio

[57] ABSTRACT

A two-terminal integral-cycling solid state relay comprises a first semiconductive switching device having a control electrode for controlling the conductivity between two main electrodes, the latter being attachable to a cyclic power source in series with a load. A novel control circuit is utilized for providing a firing signal to the control electrode in response to an energization signal, only when there is approximately zero instantaneous voltage between the main electrodes of the first switching device at the beginning of a power signal cycle. The control circuit includes a memory so that when the relay is open, the first semiconductive switching device will stop conducting between its main electrodes only at the end of the power signal cycle when the instantaneous current through the main electrodes is substantially zero.

11 Claims, 2 Drawing Figures

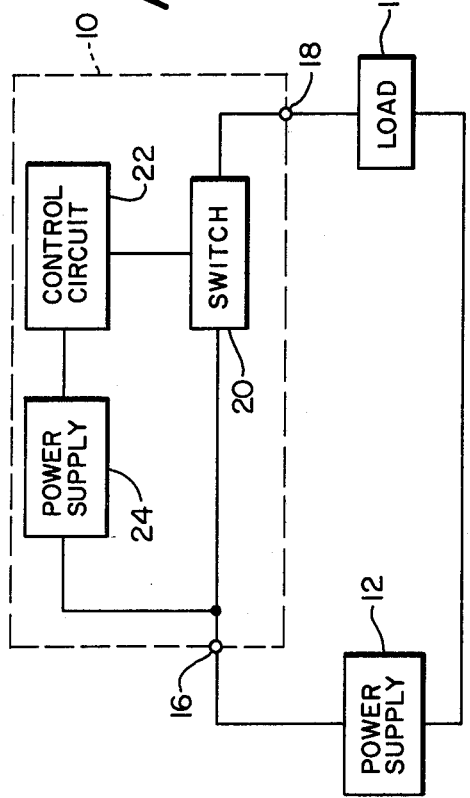
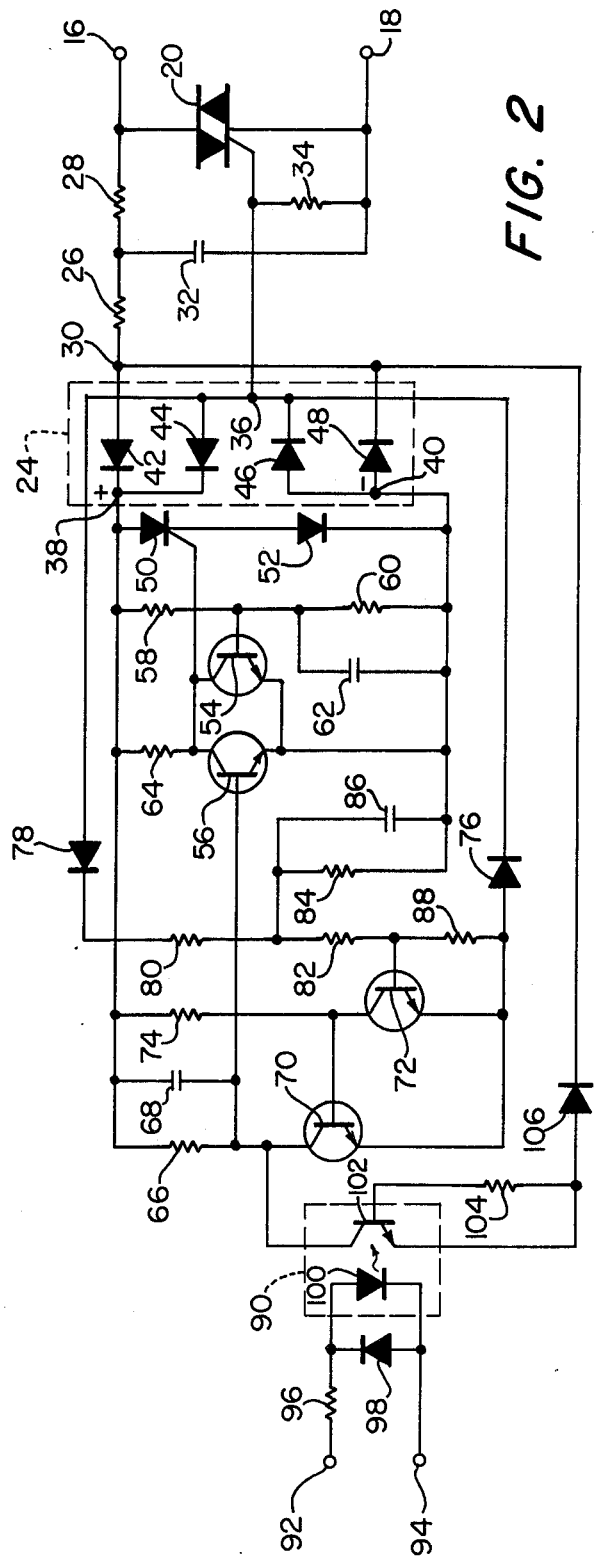

INTEGRAL CYCLING RELAY

This application is a continuation of my copending application Ser. No. 667,712, now abandoned, filed Mar. 17, 1976 for Integral Cycling Relay.

This invention relates to relays and more particularly to an integral-cycling, two-terminal, zero-voltage firing solid state relay circuit.

Various methods of performing switching functions are encountered in electrical control, computing, information, routing, monitoring, report-back, alarm, device protection, etc. One type of switch which has become increasingly popular is the solid state relay. Many of the solid state relays which are presently available, selectively control a gating signal to a semiconductor switch, such as a thyristor, for coupling an AC electrical power source to a load. The gating of the thyristor is usually accomplished by one of two techniques, e.g., either by asynchronous control or zero-voltage firing (synchronous) control. Relays employing the asynchronous technique, typically contain means for gating or firing the thyristor and, thereby close the relay at any time or after a specified time delay, after the start of each cycle of the power line signal. A major disadvantage of the asynchronous relay is the production of radio frequency interference which can affect the operation of inductive devices in the general vicinity of the relay.

In zero-voltage firing control, the thyristor is triggered to a closed or conductive state only when the instantaneous voltage across the relay is substantially zero, so that there are no abrupt changes in the current delivered to the load. Consequently, there is a minimum of radio frequency interference. Many of the zero-voltage firing solid state relays are of the half-cycling type. Half-cycling, however, creates other problems, particularly with inductive loads. One problem arises from the fact that long duration or net DC currents can arise from an unfortunate sequence of triggering signals and cause saturation, overheating and, quite often, the destruction of an inductive load such as a transformer, motor, inductor, etc. Further, AC inductive power sources, such as utility transformers, which are used to supply the AC power, can also become victims of overheating due to the same net DC current.

Another associated problem arising from half-cycling can occur when there is a coincidence of two or more consecutive current half-cycles of the same polarity, which easily can occur when an inductive load is turned on in the same polarity that it was turned off. This can result in saturation or near saturation of the inductive load. The resulting current surges from the saturated or near saturated inductive load often are responsible for the failure of conventional half-cycling solid state relays.

One suggestion which has been made for overcoming the problems of half-cycling solid state relays is a technique referred to as "integral cycling". Integral-cycling solid state relays generally include means for controlling the firing of the thyristor in such a manner that when the switch is closed on a first half-cycle of a predetermined polarity, it is electrically bound to stay closed on the next succeeding half-cycle which is of a polarity opposite that of the first half-cycle.

Integral-cycling solid state relays heretofore known, however, suffer from one or more disadvantages. For example, one integral-cycling solid state relay is described schematically in the RCA Linear Integrated Circuits Manual published by RCA in 1973, page 303. The design described is a three terminal device with access required to the load and both sides of the power line for powering an integrated circuit and the integral-cycling network. The design is not only relative costly, but a great deal of standby power is consumed in this circuit by large dropping resistors. Further, the integrated circuit disclosed is only suitable as a zero voltage switch for use with loads which are purely resistive or only slightly inductive. Additionally, even for loads which are slightly inductive, circuit components often must be matched to the power factor of the load for proper thyristor triggering.

Another integral-cycling solid state relay which is known is described in U.S. Pat. No. 3,745,378 issued to Pritchett. The relay circuit described therein is a proportional controller in which the firing of a triac is controlled by a zero-voltage switch so as to provide electrical power to a load in proportion to temperature variations detected by a thermistor. The circuit is not only relatively complex and costly but is also a three-terminal device and thus suffers from some of the same disadvantages as described with respect to the RCA circuit described above.

The present invention relates to two-terminal solid state relays which generally comprise only two power terminals (for the relay contact) with no auxilliary (third) terminal which can derive power from across the power line.

It is therefore an object of the present invention to provide an improved two-terminal integral-cycling solid state relay which overcomes the aforementioned problems.

Another object of the present invention is to provide an improved relatively low-cost, integral-cycling, two-terminal, zero-voltage control circuit for firing solid state relay switches.

Still another object of the present invention is to provide an integral-cycling solid state relay having low current drain or leakage and which requires no supplementary power connection, i.e. the third terminal.

Yet another object of the present invention is to provide an integral-cycling solid state relay which operates equally well with inductive and resistive loads and has excellent power factor and surge capabilities without the need for matching circuit componentry.

These and other objects are achieved by a two-terminal solid state relay of the type comprising a first semi-conductive switching device having a control electrode for controlling the conductivity between a pair of main electrodes the latter being attachable to a cyclic power source and a load. Improved control circuit means includes a memory so that a firing signal is provided to the control electrode in response to an energization signal only at the beginning of a power line signal cycle when there is approximately zero instantaneous voltage between the main electrodes of the first switching device. The control circuit means also includes means for maintaining the switching device conductive so that when the relay switch is opened, the first semiconductive switching device will stop conducting between its main electrodes only at the end of a power line cycle.

Other objects of the invention will in part be obvious and will in part appear hereinafter. The invention accordingly comprises the apparatus possessing the construction, combination of elements, and arrangement of parts which are exemplified in the following detailed disclosure, and the scope of the application of which will be indicated in the claims.

For a fuller understanding of the nature and objects of the present invention, reference should be had to the following detailed description taken in connection with the accompanying drawing wherein:

FIG. 1 is a block diagram of a system incorporating the present invention; and

FIG. 2 is a detailed circuit diagram of the preferred embodiment of the present invention.

Referring to FIG. 1, two-terminal solid state relay 10 is connected at its terminals 16 and 18 in series with power supply or source 12 and load 14. Supply 12 provides an AC signal, the average value of which is of course zero. For purposes of explanation, hereinafter, the signal cycle will be considered to start at the beginning of a positive half cycle and finish at the end of the negative half cycle. The period of the power signal provided by supply 12 will be defined as having a half cycle which is positive when the instantaneous voltage at terminal 18 is greater than the instantaneous voltage at terminal 16. Alternatively, however, it will be understood that the terminal connections could be reversed with respect to the source 12 and load 14, and the positive half cycle defined when the instantaneous voltage at terminal 18 is greater than the instantaneous voltage at terminal 16 and the negative half cycle defined when the instantaneous voltage at terminal 16 exceeds the instantaneous voltage at terminal 18.

Relay 10 includes a semiconductive switching device 20 which selectively couples supply 12 with load 14. When the relay is "open", device 20 is in a high impedance state and nonconductive and when the relay is "closed", device 20 is in a low impedance state and conductive. The conductivity of device 20 is controlled by control circuit 22 which derives its power from power supply 24 which in turn preferably utilizes power from source 12. The present invention is primarily directed to a unique control circuit 22, a preferred embodiment of which is described in FIG. 2.

Referring to FIG. 2, power terminals 16 and 18 are connected to the main electrodes of semiconductor switching device 20. Terminal 16 is also connected through current limiting resistors 26 and 28 to an AC junction terminal 30 of D.C. voltage supply 24. Terminal 18 is connected through capacitor 32 to the junction formed by resistors 26 and 28 and is additionally connected to the gate or control electrode of switching device 20 through the biasing resistor 34. Resistors 26 and 28 and capacitor 32 function to limit dV/dt across the semiconductor switching device in order to inhibit false firing of device 20 by presenting a low impedance to its gate electrode. Switching device 20 is preferably a bidirectional thyristor or triac, although as well known in the art, other devices can be used such as two silicon controlled rectifiers connected in parallel but opposite directions. In general, device 20 functions as a latching device which is triggered into a low impedance state by a current signal at its gate electrode having an amplitude above some predetermined value and turns off or goes back to a high impedance state only when the current through the main terminals of the device is substantially zero. The gate electrode of device 20 is also connected to the AC junction terminal 36 of D.C. power supply 24. The latter can be any device which utilizes an AC voltage at its AC input terminals 30 and 36 and provides a rectified voltage output at its positive and negative DC junction terminals, 38 and 40, respectively. Preferably, supply 24 is a full wave rectifying bridge comprising diodes 42, 44, 46 and 48, in which the anode of diode 42 and the cathode of diode 48 are connected together to form AC terminal 30 and the anode of diode 44 and the cathode of diode 46 are connected together to form AC terminal 36. Similarly, the cathodes of diode 42 and 44 are connected together to form positive DC junction terminal 38 of D.C. power supply 24 and the anodes of diodes 46 and 48 are connected together to form negative DC junction terminal 40.

Generally, a second semiconductor switch is utilized to control the current into or out of the control electrodes of device 20. The second semiconductor switch preferably is a silicon controlled rectifier 50 having an anode, cathode and gate electrodes. When the current into the gate of rectifier 50 exceeds some predetermined value, rectifier 50 latches into a conductive state between its anode to cathode. Conversely, rectifier 50 reassumes its non-conductive state when the current level into the anode falls below some predetermined value. The anode of silicon controlled rectifier 50 is connected to terminal 38 while the cathode is connected to the anode of biasing diode 52. The cathode of the latter is connected to negative DC terminal 40 of supply 24. The gate of rectifier 50 is connected to the collectors of npn transistors 54 and 56. Transistor 54 is biased by a voltage divider, i.e. the base of the transistor is connected through resistor 58 to terminal 38 and through resistor 60 to terminal 40. The base of transistor 54 is also connected to the terminal 40 through capacitor 62. The emitter of transistor 54 is connected together with the emitter of transistor 56 to terminal 40. The collectors of transistors 54 and 56 are connected together and to terminal 38 through resistor 64, while the base of transistor 56 is connected through both the resistor 66 and capacitor 68 to terminal 38 and directly to the collector of npn transistor 70. The base of transistor 70 is connected to the collector of npn transistor 72 and through biasing resistor 74 to DC terminal 38 of supply 24. The emitters of both transistors 70 and 72 are tied together and to the anode of diode 76, and the cathode of diode 76 in turn is connected to the terminal 36. The terminal 36 is also connected to the anode of a diode 78, the cathode of the latter being connected to a resistor 80. The latter is connected in turn to each of the resistors 82 and 84 as well as capacitor 86. Both the resistor 84 and capacitor 86 are connected to DC terminal 40 of power supply 24, while resistor 82 is connected to the base of transistor 72. The base of transistor 72 is also connected through resistor 88 to the anode of diode 76.

As will be more apparent hereinafter, transistors 70 and 72, resistor 74, diodes 76 and 78, and the network formed by resistors 80, 82, 84, 88 and capacitor 86 coact to provide a memory as to whether the relay is on or off during a positive half-cycle so that the relay will remain on or off during the following negative half-cycle.

Means, in the form of optical isolator circuit 90, are additionally provided for introducing a trigger signal into the control circuit so that the relay will only turn on at the beginning of a cycle of the power signal. Circuit 90 includes a pair of input terminals 92 and 94 across which a trigger signal can be applied for closing the relay. Terminal 92 is connected through current limiting resistor 96 to the cathode of diode 98 and to the anode of light emitting diode 100, while terminal 94 is connected directly to the anode of diode 98 and the cathode of light emitting diode 100. Diode 100, when energized, provides an optical signal which causes a low impedance between the collector and emitter of phototransistor 102. The collector of transistor 102 is connected to the junction formed by resistor 66, capacitor 68 the base of transistor 56 and the collector of transistor 70. The emitter of phototransistor 102 is directly connected to the anode of diode 106, and the base is connected through resistor 104 to the anode of diode 106. The cathode of diode 106 is connected directly to AC terminal 30 of supply 24.

Now turning to the operation of the embodiment of FIG. 2, assuming that the relay has not been turned on by an excitation signal at terminals 92 and 94, the voltage across terminals 16 and 18 is substantially but not quite the same in magnitude as that supplied by cyclic power supply 12. This slight difference in voltage is due to the very small amount of current used by the solid state relay electronics when the relay is in its off or nonconductive state and the fact that the load impedance is generally small in magnitude. Additionally, the voltage across terminals 30 and 36 is substantially the same as the voltage across terminals 16 and 18, respectively.

During alternate half-cycles of voltage across the relay, diodes 42 and 44 are alternately forward and reversed biased and diodes 46 and 48 are similarly alternately forward and reversed biased. As a result, the voltage between terminals 38 and 40 is always positive or zero and is the full wave rectified version of the voltage between terminals 30 and 36.

If no excitation signal has been applied to the control circuit, silicon controlled rectifier 50 will be in a high impedance state and inhibited from firing. If however, an excitation signal is provided at terminals 92 and 94, rectifier 50 is triggered into an on or conductive state. In its conductive state, rectifier 50 effectively shorts out D.C. supply terminals 38 and 40 and causes the voltage across resistor 34 to increase until current flows into the gate or control terminal of device 20. This gate signal, in turn, triggers device 20 into a conductive state for the remainder of the half-cycle until the current through its main terminals is substantially zero. Both devices 50 and 20 reassume their nonconductive state when this zero-current crossing occurs. When device 20 is on, practically no voltage exists across terminals 30 and 36 and across terminals 38 and 40. As will be evident hereinafter, if the relay switch was closed during the positive half cycle, the control circuit will act to provide another trigger signal to device 50 immediately following that positive half cycle at the beginning of the negative half cycle in order to keep the relay switch, device 20, closed effectively for the complete power cycle.

In order to achieve zero voltage firing at the beginning of a half-cycle, transistor 54 is maintained in a conductive condition by the application of a sufficient base signal from the voltage divider formed by resistors 58 and 60 and capacitor 62 when the instantaneous voltage across power terminals 16 and 18 is relatively large. When transistor 54 is conductive, it clamps the gate of rectifier 50 to a voltage below its cathode and thus inhibits the rectifier from turning on. However, when the line voltage across terminals 16 and 18 decreases to a value sufficient to reduce the voltage at the base of transistor 54, the latter turns off. Capacitor 62 adds a small amount of phase shift to this zero voltage detector to inhibit the firing of rectifier 50 until sufficient voltage has become available to insure sufficient holding current availability for device 20.

Also, the conduction of current through transistor 56 will clamp the voltage at the gate electrode of silicon controlled rectifier 50 to below its cathode so that the rectifier is prevented from conducting. In this respect, diode 52 serves to establish a bias point for silicon controlled rectifier 50 to insure that when either or both transistors 54 and 56 are conducting, the rectifier will be inhibited from firing. Resistor 64 is the means through which current flows to turn on controlled rectifier 50 when neither of the aforementioned transistors is on. Thus, the state of the relay switch for a given half-cycle is determined by the state of transistor 56 at the beginning of that half-cycle when transistor 54 is off.

If neither transistor 70 nor phototransistor 102 is in a conductive state, at the beginning of each half-cycle, the current through resistor 66 will act to turn on transistor 56 and thus inhibit the closure of the relay switch for each half-cycle. Capacitor 68 decreases the control circuit's susceptibility to noise.

In order to facilitate integral-cycling operation, it is necessary that the relay switch should only turn on at the beginning of a half-cycle of a given polarity and stay on involuntarily for the following half-cycle of opposite polarity. For this reason, diode 106 acts so that phototransistor 102 can only turn on and diode 106 can only become forward biased and conduct current during positive half-cycles. Likewise, diode 76 and transistor 70 perform in a similar manner except only for negative half-cycles. Since the state of phototransistor 102 is controlled by the external excitation signal at terminals 92 and 94 and since the state of transistor 70 is controlled by the state of the memory circuit (formed by transistors 70 and 72, resistor 74, diodes 76 and 78, and the network formed by resistors 80, 82, 84, 88 and capacitor 86), the excitation signal will govern whether the relay turns on for positive half-cycles and the memory circuit will govern whether the relay turns on for negative half-cycles.

When a positive excitation signal is applied at terminals 92 and 94 at the beginning of a positive half-cycle, it acts to turn on or close the relay switch for that half-cycle. This is accomplished by the current that develops and flows through current limiting resistor 96 and light emitting diode 100. Diode 100 transmits optical radiation to phototransistor 102 so that the latter may conduct. Both phototransistor 102 and diode 106 will conduct so as to effectively clamp the base of transistor 56 to its emitter, but can only do so during positive half-cycles. Diode 106 cannot conduct during negative half-cycles. Thus, an input excitation signal that is present at the beginning of the positive half-cycle causes transistor 56 to turn off and allows a firing signal to be applied to the silicon controlled rectifier 50 when transistor 54 becomes non-conductive triggering device 20 on. If an input excitation signal does not exist at this time, resistor 104 will insure that phototransistor 102 is held in a nonconductive state. This, in turn, allows the current through resistor 66 to flow into the base of transistors 56 and turn it on and exhibit the firing of the previously mentioned thyristor 50 and device 20. In this case, the relay is open.

As previously mentioned, transistors 70 and 72, resistor 74, diodes 76 and 78, and the network formed by resistors 80, 82, 84, 88 and capacitor 86 coact to provide a memory as to whether the relay was on or off during the positive half-cycle so that the relay switch will remain on or off during the following negative half-cycle. For reasons which will be apparent hereinafter, diode 78 is forward biased and conducting during each positive half-cycle that the relay is open. Since a large voltage exists across terminals 16 and 18 and across terminals 38 and 40 under these conditions, capacitor 86 will charge through the voltage divider formed by resistors 80 and 84. During the following negative half-cycle, diode 78 is reversed biased and nonconducting while diode 76 is forward biased and conducting. The RC time constant provided by resistors 82, 84 and 88 and capacitor 86 is such that a sufficient amount of charge is stored in capacitor 86 during a positive half-cycle to keep transistor 72 on during at least the beginning of the succeeding negative half-cycle. However, any charge stored in capacitor 86 during the positive half-cycle will eventually discharge through resistors 82, 84 and 88 during the negative half-cycle. In this way, the memory is cleared of information as the charge on memory capacitor 86 decays substantially to zero by the end of every negative half-cycle that the relay switch is in its nonconductive or off state.

Assuming that the relay switch is open during the positive half-cycle, the result turns that transistor 72 is on at the beginning of the following half-cycle, which is negative. The base of transistor 70 will be clamped directly to its emitter by the conduction of current in the collector and emitter terminals of transistor 72. Transistor 70 will be in an off state and resistor 66 will again act to turn on transistor 56 in order in inhibit the firing of silicon controlled rectifier 50 and the closure of semiconductor device 20 as it did during the previous half-cycle.

If the relay switch is closed during the positive half-cycle, practically no voltage is available to charge capacitor 86, since the voltage drop across the power terminals 16 and 18 of semiconductor switch 20 is quite small when the switch has been fired into a conductive state and is coupling power supply 12 to load 14. Thus, with no charge on capacitor 86 even at the beginning of the following half-cycle, transistor 72 will be in an off state. Current flowing through resistor 74 will then be able to flow into the base of transistor 70 so that the latter is conductive. Transistor 70, in conjunction with diode 76, will effectively clamp the base of transistor 56 to its emitter during the following negative half-cycle as did phototransistor 102 and diode 106 during the positive half-cycle. Thyristor 50 and device 20 will then be enabled for firing and will turn on again at the beginning of the negative half-cycle.

Thus, integral-cycling operation is achieved in that whatever state the relay switch is in during the positive half-cycle, it will be in the same state during the following negative half-cycle. Even if the input excitation signal is removed before the negative half-cycle, the relay will remain closed for the complete power cycle. And, since the memory is cleared by the end of each negative half-cycle, when the relay is open, the whole sequence of events will repeat during the next power cycle without prejudice from earlier power cycles.

The pesent invention thus described offers several advantages. One advantage is provided by the fact that the relay turns on only at the beginning of a half cycle of a predetermined polarity of the cyclic source and will only turn off at the end of a half cycle of opposite polarity. As a consequence, any residual magnetic flux left in an inductive load will be cancelled and not reinforced or increased when the relay is turned on. Any surge current that would have arisen had the inductive load been saturated due to a DC component of current is eliminated.

Another advantage, particularly where the load is switched on and off at high rates, is that the relay introduces no net DC component which can cause overheating and saturation of inductive power sources and loads. The present invention requires no supplementary power connection as necessitated by other integral cycling circuits, and requires very little current to operate. The present invention is relatively inexpensive, and the components are such that they lend themselves to monolithic integrated circuitry implementation, particularly the transistors which can all be low voltage types. Also transient surges and electrical noise which are normally generated by arcing contacts of a high rate of inrush current are eliminated. Finally, the invention operates equally as well with resistive and inductive loads, and has excellent power factor and surge capabilities.

Since certain changes may be made in the above apparatus without departing from the scope of the invention herein involved, it is intended that all matter contained in the above description or shown in the accompanying drawing shall be interpreted in an illustrative and not in a limiting sense.

What is claimed is:

1. In a relay circuit including a pair of terminals for electrically coupling said circuit to an AC power source, and a load, and semiconductor means controllable by a control signal for selectively switching power from said power source to said load in response to a trigger signal, an improved control circuit for providing said control signal and comprising in combination:
   means for determining when the instantaneous voltage across said terminals is substantially zero;
   detection means for detecting the polarity of said instantaneous voltage;
   memory means, responsive to said trigger signal, for storing a portion of electrical energy from said power source only in the absence of said trigger signal and only during half cycles of a predetermined polarity of the voltage of the power source as determined by said detection means, and for discharging said portion during each following half cycle of opposite polarity; and
   first means, responsive to said means for determining and responsive to the discharge of said portion of electrical energy during the presence of said trigger signal, for generating said control signal to place said semiconductor means in a conductive state commencing only when said portion of stored energy is substantially zero.

2. A relay circuit in accordance with claim 1, further including second means, responsive to said means for determining and responsive to the withdrawal of said trigger signal, for inhibiting said control signal to place said semiconductor means in a nonconductive state commencing only when said instantaneous current from the power source is substantially zero.

3. A relay circuit in accordance with claim 2, wherein said memory means includes first unidirectional conductor means for conducting said portion of electrical energy in the absence of said trigger signal during half cycles of said predetermined polarity, means for storing said portion of electrical energy conducted through said first unidirectional conductor; and second unidirectional conductor means for conducting said electrical energy discharged from said means for storing during each of said following half cycles of opposite polarity.

4. A relay circuit in accordance with claim 3 wherein said first means responsive to said means for determining comprises switch means controllable by a second control signal wherein said switch means generates said first mentioned control signal in response to said second control signal and inhibits said first control signal in the absence of said second control signal.

5. A relay circuit in accordance with claim 4, wherein said first means responsive to said means for determining further includes means, responsive to the discharge of said electrical energy through said second unidirectional conductor means, for generating said second control signal to said switch means during the presence of said trigger signal to place said switch means in a conductive state, commencing only when said instantaneous voltage is zero and for inhibiting said second control signal during the absence of said trigger signal commencing only when said instantaneous voltage is zero and the last half cycle is a half cycle of opposite polarity.

6. A relay circuit in accordance with claim 5, further including second switching means responsive to the presence of said trigger signal for inhibiting said second control signal during half cycles of said predetermined polarity and third switching means controllable by the discharge energy from said means for storing so as to conduct to inhibit said second control signal during half cycles of said opposite polarity.

7. A relay circuit in accordance with claim 6 wherein said second switching means includes an optical isolator circuit responsive to said trigger signal and third unidirectional conductor means.

8. A relay circuit in accordance with claim 6 wherein, said means for storing includes a capacitor, said third switching means includes a transistor having its base biased by current discharged from said capacitor during half cycles of said opposite polarity.

9. A relay circuit in accordance with claim 1, further including D.C. power supply means for providing said portion of said electrical energy.

10. A relay circuit in accordance with claim 9, wherein said power supply means includes a full wave rectifying bridge having two AC terminals connected to said semiconductor means and two DC terminals for providing said portion of said electrical energy.

11. In an integral-cycling, zero-axis firing relay circuit for controlling the application of an AC signal from a power source to a load, said power source and said load being suitably coupled to system ground, said circuit comprising bidirectional switching means, responsive to a control signal, for selectively coupling said source to said load, and control means for applying said control signal to said switching means in response to a trigger signal, said switching means being only conductive, once rendered conductive, during full alternative half cycles of the voltage of said AC signal, the improvement comprising:

said control means including memory means for storing a portion of electrical energy from said power source only during the first half cycle of each full cycle when said switching means is nonconductive and for discharging said energy during each subsequent half cycle so that said switching means is maintained nonconductive and can only be placed in a conductive state commencing at the beginning of a full alternate half cycle, said circuit further including a pair of terminals for electrically coupling said circuit to said source and said load, wherein said control means provides integral cycling, zero-axis firing between said terminals, wherein said memory means further includes means for determining when the instantaneous voltage across said terminals is substantially zero, and detection means for detecting the polarity of the instantaneous voltage.

* * * * *